(12) United States Patent
Weidner

(10) Patent No.: US 7,859,005 B2
(45) Date of Patent: Dec. 28, 2010

(54) METHOD FOR THE PRODUCTION OF A SEMICONDUCTOR COMPONENT COMPRISING A PLANAR CONTACT, AND SEMICONDUCTOR COMPONENT

(75) Inventor: Karl Weidner, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/991,197

(22) PCT Filed: Aug. 30, 2006

(86) PCT No.: PCT/DE2006/001513

§ 371 (c)(1),
(2), (4) Date: May 19, 2009

(87) PCT Pub. No.: WO2007/025521

PCT Pub. Date: Mar. 8, 2007

(65) Prior Publication Data

US 2009/0278157 A1  Nov. 12, 2009

(30) Foreign Application Priority Data

Aug. 30, 2005 (DE) ................. 10 2005 041 099

(51) Int. Cl.
*H01L 33/00* (2010.01)
(52) U.S. Cl. ............... 257/99; 257/690; 438/26
(58) Field of Classification Search ............... 257/99, 257/690, 644; 438/26, 618, 778
See application file for complete search history.

(56) References Cited

U.S. PATENT DOCUMENTS

| 4,017,340 | A | 4/1977 | Yerman |
| 6,218,223 | B1* | 4/2001 | Ikeda et al. ................. 438/197 |
| 6,881,980 | B1 | 4/2005 | Ting |
| 6,911,714 | B2 | 6/2005 | Parsons et al. |
| 7,402,457 | B2* | 7/2008 | Hase et al. ................. 438/106 |
| 2005/0032347 | A1 | 2/2005 | Hase et al. |
| 2005/0151141 | A1 | 7/2005 | Grotsch et al. |

FOREIGN PATENT DOCUMENTS

| DE | 103 51 397 | 6/2005 |
| EP | 1 313 146 | 5/2003 |
| WO | WO 03/030247 | 4/2003 |

\* cited by examiner

*Primary Examiner*—Mark Prenty
(74) *Attorney, Agent, or Firm*—Cohen Pontani Lieberman & Pavane LLP

(57) ABSTRACT

In a method for producing a semiconductor component, in particular a semiconductor structure having a surface structure or topography which is produced by means of electronic components (2) on a substrate (1), at least one electronic component (2) is applied to a substrate (1), and an isolation layer (3) is applied to the topography which is produced by means of the at least one component (2) on the substrate (1). Contact-making openings (5) are then produced in the isolation layer (3) at contact points (8, 9) for the at least one electronic component, the isolation layer (3) and the contact points (8, 9) in the contact-making openings (5) are planar-metallized, and the metallization is structured in order to produce electrical connections (4), with the isolation layer (3) having a glass coating.

20 Claims, 1 Drawing Sheet

METHOD FOR THE PRODUCTION OF A SEMICONDUCTOR COMPONENT COMPRISING A PLANAR CONTACT, AND SEMICONDUCTOR COMPONENT

RELATED APPLICATIONS

This is a U.S. national stage of application No. PCT/DE2006/001513, filed on 30 Aug. 2006.

This patent application claims the priority of German patent application no. 10 2005 041 099.5 filed Aug. 30, 2005, the disclosure content of which is hereby incorporated by reference.

FIELD OF THE INVENTION

The present invention relates to a semiconductor component having a substrate, to which at least one electronic component is applied, and an isolation layer, and to a method for producing such a component.

BACKGROUND OF THE INVENTION

In a planar connection technology which is known from the document WO 03/030247 A2 and is also referred to as SiPLIT (Siemens Planar Interconnect Technology) technology, a sheet which is laminated uniformly over the topography encloses the parts in a predetermined film thickness and forms an isolation layer. The fundamental concept of a flat design with planar connection technology allows versatile, application-specific design options, by the use of an isolation film.

Conventionally, parts have until now been covered by a transparent encapsulation compound or isolation film. However, the use of conventional isolation films partially restricts the thermal, ageing-related and UV-related resistance.

SUMMARY OF THE INVENTION

One object of the present invention is to specify an improved semiconductor component and a method for producing it, with which contact is made by means of a planar connection technology and which is distinguished in particular by improved thermo-mechanical and chemico-physical stability. In particular, it should have an isolation layer which is resistant to ageing, is largely unaffected by environmental influences, and, in conjunction with light sources, allows a high light yield.

In a method according to one embodiment of the invention for producing a semiconductor component, in particular a semiconductor structure having a surface structure or topography which is produced by means of electronic components on a substrate, one electronic component or a plurality of electronic components is or are applied to a substrate, and an isolation layer is applied to the topography produced by means of the at least one component on the substrate.

Contact-making openings are then produced in the isolation layer at contact points for the at least one electronic component, the isolation layer and the contact points in the contact-making openings are planar-metallized, and the metallization is structured in order to produce electrical connections, with the isolation layer having a glass coating.

The use of a glass coating instead of the conventional use of polymer films allows a hermetically sealed cover to be produced on the structure which is formed on the substrate from one or more electronic components, in particular a structure comprising one or more LEDs, such that the structure is not subject to any environmental influences. A further advantage is the high degree of transparency, thus allowing a high light yield in conjunction with light sources. Since a glass coating has high UV stability with respect to ultraviolet radiation, the ageing resistance of the structure is better than that of conventional films.

The glass coating allows comparatively high thermo-mechanical stability. Furthermore, the coefficient of thermal expansion CTE of the glass coating is preferably matched to that of the at least one component and/or substrate. The coefficient of thermal expansion of the glass coating preferably has a value of and including between $5*10^{-7}$ $K^{-1}$ and including $30*10^{-7}$ $K^{-1}$. Furthermore, the glass coating is distinguished by high chemico-physical stability.

The use of a glass coating as an isolation layer has no significant influence on the further method steps for producing a planar connection structure, so that the use of glass coatings can easily be integrated in known methods for producing planar connection and surface-mounted structures. The replacement of polymer films by glass coating thus, in particular, provides process compatibility for the planar connection method (SiPLIT method) known from the document WO 03/020247 A2. The disclosure content of this document is hereby incorporated by reference.

The isolation layer may be composed entirely of the glass coating. According to one advantageous refinement, the glass coating has borosilicate glass. The glass coating may be produced completely from borosilicate glass. The glass may contain alkali. It may likewise be formed from a plurality of glass layers.

According to a further advantageous refinement, a polymer coating is first of all applied to the components and/or the substrate, and then the isolation layer, with the isolation layer being thermomechanically decoupled from the component and substrate surfaces. The polymer coating is preferably sufficiently highly elastic to compensate for thermomechanical stresses. Differences between the coefficients of thermal expansion (CTE) of the glass coating and component and substrate surfaces can advantageously be compensated for by means of the polymer coating. This is particularly advantageous for semiconductor components in which the component is severely heated during operation, for example in the case of high-power LEDs. In this case, the polymer coating avoids the risk of fracture of the glass layer as a result of mechanical stresses, which can occur because of high temperature differences between the rest state and the operating state of the component.

According to a further advantageous refinement, the isolation layer has glass coatings and polymer coatings arranged alongside one another. This allows the isolation layer to be effectively matched to the respective functions of the components. A glass coating is advantageous for LED chips, in particular for LED chips in which at least a portion of the emitted radiation is at wavelengths in the ultraviolet spectral range, since a glass coating has better radiation stability than polymer layers. For example, it is possible for one or more LED chips arranged on the substrate to be provided with an isolation layer composed of glass, while the substrate and/or one or more further components arranged on the substrate is or are provided with an isolation layer composed of a polymer.

According to a further advantageous refinement, the glass coating is arranged only in the electrically active area of a component. In this case, the light-emitting area is assumed to be the electrically active area, for example of an LED chip. In particular, the glass coating can be applied to the surface and the side flanks of an LED chip.

According to a further advantageous refinement, the glass coating hermetically encapsulates at least one electrical component, in particular an LED chip.

According to one preferred refinement, the glass coating has a thickness in the range from 5 to 500 μm.

According to a further advantageous refinement, the glass coating is applied by means of physical vapor deposition (PVD), and/or plasma ion assisted deposition (PIAD), in particular electron-beam PVD-PIAD.

According to a further advantageous refinement, the glass coating is structured by means of a lift-off method.

According to a further advantageous refinement, contact openings are produced by means of laser processing, chemical etching, dry etching or sandblasting.

According to a further advantageous refinement, the metallization is produced by means of a seed layer, for example composed of TiW and/or TiCu. In this case, by way of example, a thin metallic layer is applied to the isolation layer by means of sputtering. By way of example CVD, PVD or electrolytic methods may be used for subsequently applying the metallization.

According to a further advantageous refinement, the metallization is structured by means of a photographic method.

DETAILED DESCRIPTION OF THE DRAWINGS

Identical elements or elements having the same effect are provided with the same reference symbols in the figures.

Figure 1:
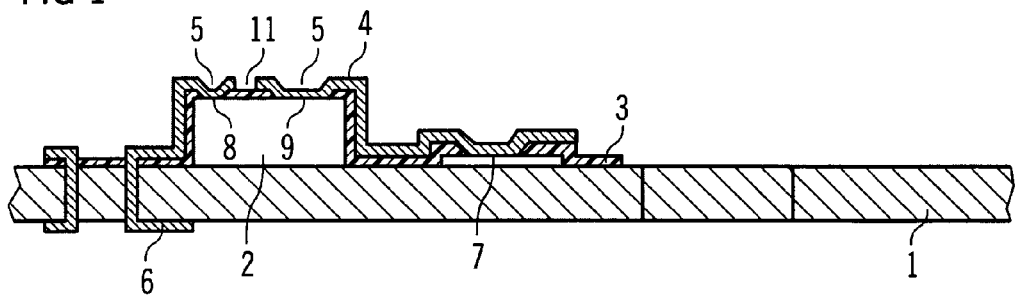
FIG. 1 shows a schematic illustration of a cross section through a first exemplary embodiment of a semiconductor component according to the invention.

FIG. 1 shows a semiconductor component in which an LED chip 2 is arranged on a substrate 1. The substrate 1 may, for example, be a wafer, a printed circuit board (PCB) and/or a flexible material.

An isolation layer 3 composed of a glass, for example a thin borosilicate glass layer, is applied to the substrate 1 and to the LED chip 2, and is used as a hermetic covering for the LED chip 2 and for the substrate 1. The glass coating 3 therefore advantageously protects the LED chip 2 and the substrate 1 against environmental influences, in particular such as moisture, dirt or UV radiation.

The isolation layer 3 also acts as electrical isolation between sub areas of the LED chip 2, in particular the side flanks of the LED chip 2, and electrical connections 4 which are used for planar electrical contact with the LED chip. In this case, the expression planar contact means a wire-free contact by means of a structured metallization layer which forms the electrical connections 4. In particular, no bonding wire is therefore used to make contact with the LED chip 2. This advantageously allows the semiconductor component to have a comparatively short physical height. In particular, the isolation layer 3 prevents short-circuiting of the LED chip 2 which would otherwise occur if the metallization 4 were to be applied directly onto the side flanks of the LED chip 2.

The thin glass coating 3 is preferably produced by a PVD or a PIAD method.

Once the electronic component 2 and the substrate 1 have been applied, the isolation layer 3 can be structured by means of a lift-off technique.

Openings 5 are created in the isolation layer 3 in order to produce planar contacts, preferably by laser processing, chemical etching, dry etching and/or sandblasting. Other methods are likewise feasible.

The electrical connections 4 are preferably formed on the isolation layer 3 by applying and structuring a metallization layer. Before the metallization layer is applied, a thin seed layer, for example composed of TiCu or TiW is preferably applied to the isolation layer. By way of example, the metallization may be structured by means of a photolithographic method. In particular, the structuring of the metallization cuts out a radiation outlet area 11 of the LED chip from the metallization 4. The glass coating 3 is advantageously highly transparent, for the radiation emitted from the LED chip 2.

In the exemplary embodiment, a first connecting contact 8 of the LED chip 2 is connected to a rear-face contact 6 on the side of the substrate 1 facing away from the LED chip 2. A second connecting contact 9 of the LED chip 2 is connected to a front-face contact 7 on the front-face side of the substrate 1 facing the component 2. Other variants of the contact are also feasible, of course.

The encapsulation of the LED chip 2 with borosilicate glass as a hermetic cover and as a dielectric is particularly suitable for a planar connection and surface-mounting technique, for example as described in patent application WO 03/030247 A2.

Figure 2:
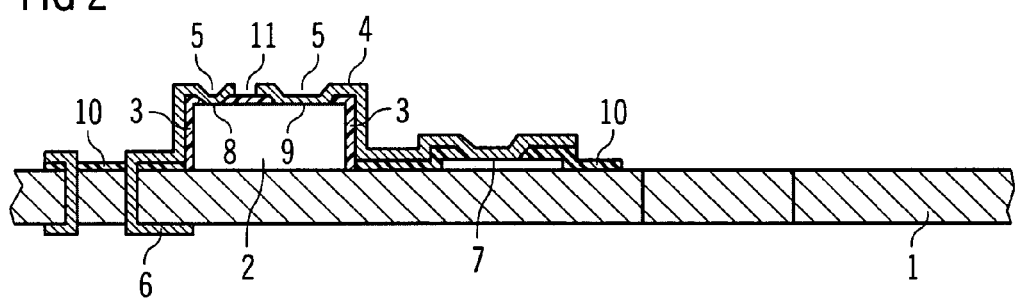
FIG. 2 shows a schematic illustration of a cross section through a second exemplary embodiment of a semiconductor component according to the invention.

In the exemplary embodiment illustrated in FIG. 2, the isolation layer has sub areas which are arranged alongside one another and are composed of a glass coating 3 and a polymer layer 10, which is transparent to light emitted by component 2. The surface and the side flanks of the LED chip 2 are provided with the glass coating 3, while sub areas of the substrate 1 are isolated from the electrical connections 4 by means of a polymer layer 10. Those sub areas of the isolation layer 3 which are directly subject to the radiation of the LED chip 2 are therefore advantageously provided with the glass coating 3.

Otherwise, the second exemplary embodiment corresponds to the first exemplary embodiment, in particular with regard to the advantageous refinements described in conjunction with FIG. 1.

Figure 3:
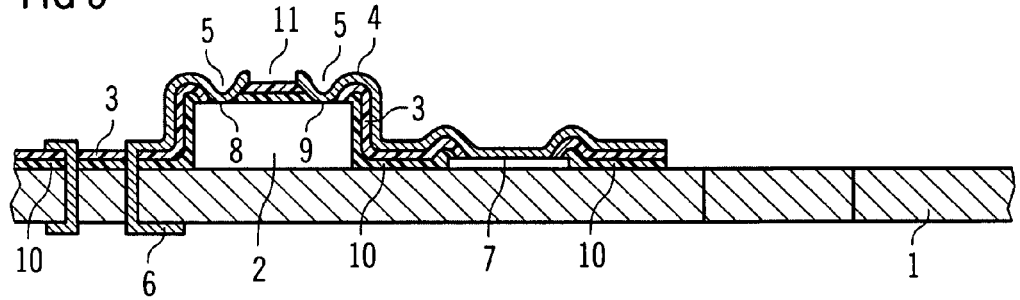
FIG. 3 shows a schematic illustration of a cross section through a third exemplary embodiment of a semiconductor component according to the invention.

In the exemplary embodiment illustrated in FIG. 3, before the isolation layer 3, which is a glass coating, was applied, a polymer layer 10 was applied to the surface structure that had been applied to the substrate and contains the LED chip 2.

This has the advantage that the glass coating 3 is not directly adjacent to the component 2, thus reducing the risk of damage to the glass layer as a result of thermal stresses which could occur because of different coefficients of thermal expansion of glass and of the semiconductor material of the component 2 and/or of the substrate 1. The polymer coating is preferably highly elastic, in order to compensate for thermomechanical stresses.

The polymer layer 10 is preferably applied to the substrate and to the LED chip 2 by means of a PIAD method.

The PIAD method is advantageous owing to the comparatively low process temperature on the component to be coated, if a polymer layer 10 which could degrade at high temperatures were to be applied before the application of the glass coating 3.

Otherwise, the third exemplary embodiment corresponds to the first exemplary embodiment, in particular with regard to the advantageous refinements described in conjunction with FIG. 1.

The invention is not restricted by the description on the basis of the exemplary embodiments. In fact, the invention covers every normal feature as well as every combination of features, which in particular includes any combination of features in the patent claims, even if this feature or this combination is not itself explicitly stated in the patent claims or exemplary embodiments.

The invention claimed is:

1. A method for producing a semiconductor component, the method comprising the steps of:
    applying at least one electronic component to a substrate;
    applying an isolation layer to a topography which is produced by means of the at least one electronic component on the substrate;
    producing contact-making openings in the isolation layer at contact points for the electronic component;
    producing planar metallization of the isolation layer and of the contact points in the contact-making openings; and
    structuring the metallization in order to produce electrical connections,
    wherein the isolation layer is made to contain a glass coating.

2. The method as claimed in claim 1, wherein the glass coating contains borosilicate glass.

3. The method as claimed in claim 1, wherein a polymer coating is first of all applied to at least one of the at least one electronic component and the substrate, and then to the isolation layer.

4. The method as claimed in claim 1, wherein the isolation layer contains glass coatings and polymer coatings arranged alongside one another.

5. The method as claimed in claim 1, wherein the glass coating is arranged only in an electrically active area of a component.

6. The method as claimed in claim 1, wherein the glass coating at least one of hermetically encapsulates and covers the electronic component.

7. The method as claimed in claim 1, wherein the glass coating is 5 to 500 μm thick.

8. The method as claimed in claim 1, wherein the glass coating is applied by means of at least one of a PVD method and a PVD-PIAD method.

9. The method as claimed in claim 1, wherein the glass coating is structured by means of a lift-off method.

10. The method as claimed in claim 1, wherein the contact-making openings are produced by means of at least one of laser processing, chemical etching, dry etching, and sand-blasting.

11. The method as claimed in claim 1, wherein the metallization is produced by means of a seed layer.

12. The method as claimed in claim 1, wherein the metallization is structured by means of photo structuring.

13. The method as claimed in claim 1, wherein the at least one electronic component is a radiation-emitting optoelectronic component.

14. The method as claimed in claim 13, wherein the optoelectronic component is an LED chip.

15. A semiconductor component comprising:
    a substrate to which at least one electronic component is applied;
    an isolation layer which is applied to the at least one electronic component; and
    contact-making openings in the isolation layer at contact points for the electronic component,
    wherein the isolation layer and the contact points in the contact-making openings are planar-metallized, the metallization being structured in order to produce electric connections,
    wherein the isolation layer contains a glass coating, and
    wherein the semiconductor component is an optoelectronic component.

16. The semiconductor component as claimed in claim 15, wherein the optoelectronic component contains one or more LED chips.

17. A semiconductor component comprising:
    a substrate to which at least one electronic component is applied;
    an isolation layer which is applied to the at least one electronic component; and
    contact-making openings in the isolation layer at contact points for the electronic component,
    wherein the isolation layer and the contact points in the contact-making openings are planar-metallized, the metallization being structured in order to produce electric connections, and
    wherein the isolation layer comprises glass coatings and polymer coatings arranged alongside one another.

18. The semiconductor component as claimed in claim 17, wherein the semiconductor component is an optoelectronic component.

19. The semiconductor component as claimed in claim 17, further comprising a polymer coating applied to at least one of the electronic component the substrate, and the isolation layer.

20. The semiconductor component as claimed in claim 15, further comprising a polymer coating applied to at least one of the substrate, the electronic component, and the isolation layer.

* * * * *